US006487295B1

(12) United States Patent
Lofgren et al.

(10) Patent No.: US 6,487,295 B1
(45) Date of Patent: Nov. 26, 2002

(54) ADAPTIVE FILTERING SYSTEM AND METHOD

(75) Inventors: Nils Lofgren, Backvagen; Per Karlsson, Trefaldighetsvagen; Gunilla Lundahl, Sclrosvagen; Fredrik Lundqvist, Wargentinsgatan, all of (SE)

(73) Assignee: Ortivus AB, Taby (SE)

( * ) Notice: Subject to any disclaimer, the term of this patent is extended or adjusted under 35 U.S.C. 154(b) by 0 days.

(21) Appl. No.: 09/404,488

(22) Filed: Sep. 23, 1999

Related U.S. Application Data

(60) Provisional application No. 60/101,940, filed on Sep. 25, 1998.

(51) Int. Cl.$^7$ .......................... H03B 29/00; H04B 15/00
(52) U.S. Cl. ................ 381/71.12; 381/94.7; 381/71.11
(58) Field of Search ............................ 381/94.7, 71.11, 381/94.1, 71.1, 71.12

(56) References Cited

U.S. PATENT DOCUMENTS

| 4,537,200 A | * | 8/1985 | Widrow |
| 4,649,505 A | * | 3/1987 | Zinser, Jr. et al. |
| 5,610,987 A | * | 3/1997 | Harley |
| 6,285,768 B1 | * | 9/2001 | Ikeda ...................... 381/71.11 |

* cited by examiner

Primary Examiner—Forester W. Isen
Assistant Examiner—Brian Pendleton
(74) Attorney, Agent, or Firm—Cooper & Dunham LLP

(57) ABSTRACT

A signal filter includes a first adaptive filter receiving a desired signal containing a noise component and a first noise correlated reference signal, and outputting a first filtered output signal. A second adaptive filter, receives the desired signal containing the noise component and a second noise correlated reference signal and outputs a second filtered output signal. Signal filter parameters of the second adaptive filter are controlled based on the first filtered output signal and the second filtered output signal.

18 Claims, 8 Drawing Sheets

ADAPTIVE FILTERING SYSTEM AND METHOD

This application claims the benefit of provisional application Ser. No. 60/101,940 filed Sep. 25, 1998.

BACKGROUND

1. Field

The present invention relates to adaptive filtering and, more specifically, to an adaptive filtering system and method for reducing interference in a medical diagnostic signal.

2. Discussion of the Related Art

Medical monitoring equipment is often used in relatively "noisy" environments. Electrical noise can corrupt signals processed by the medical monitoring equipment. For example, signals from an electrocardiogram (ECG or EKG) are often used by medical professionals to diagnose heart disorders or ailments. The ECG signals often are corrupted by electrical noise from adjacent electrical supply and power lines in the vicinity of where the equipment is being used. In particular, because the desired electrical signals in an ECG are very low voltage, they are highly susceptible to noise introduced from different sources including electrical supply and power lines.

Because a normal ECG signal has frequency components which are the same frequency as common power lines, for example, interference from the power lines which occurs on the ECG signal can be difficult to separate from the desired ECG signal.

To reduce the noise in a desired ECG signal, narrow band notch filters are often used. However, the use of narrow band notch filters is of limited utility. For example, on one hand, such a notch filter must be very selective, having a very thin bandwidth in order to avoid filtering any of the desired components of the ECG signal. This requires a high order filter which requires many components or a relatively lengthy processing time. In addition, the frequency of a power line signal typically varies somewhere around 60 Hz (50 Hz in Europe) and accordingly, the noise component may vary. Accordingly, on the other hand, a narrow band filter having a fixed notch frequency has to be relatively broad banded to reduce the noise induced by the power line. In addition, although the power line frequency in the United States is relatively fixed and stable at 60 Hz, the power line frequency in European countries can vary substantially from country to country and even from day to day in some countries. Accordingly, fixed narrow band filtering techniques are of limited utility.

Another type of filtering technique is an adaptive filtering technique. An example of an adaptive filter is shown in FIG. 1A. A reference signal r is correlated to the noise and is filtered by a finite impulse response (FIR) filter 10. Filter 10 has adaptive parameters which very the frequency of the signal being filtered based on feedback signal f. The filtered noise correlated reference signal r is then subtracted from the input signal s. Using this technique, the feedback adjusts the parameters of filter 10 so that undesired noise in the output signal is minimized. In this way, a filter with large stopband damping can be provided with minimal damping in the passband. Furthermore the frequency of the noise makes no difference, so that adaptive filtering finds some use in those countries where power line frequency varies considerably.

Various algorithms can be used to update or adjust the parameters of filter 10. One simple method is referred to as minimizing the least mean square (LMS) of the output. To achieve this, filter parameters can be updated in the following way:

$$W_{n+1} = W_n + \mu y(n) r^*(n) \quad (\text{* designates complex conjugate}) \quad (1)$$

where $W_n$, is the parameter array at sample number n and $\mu$ is the step size used to determine how fast the filter adapts.

In the adaptive filter shown in FIG. 1A, the purpose is to filter the noise correlated reference signal r so that it resembles the noise portion of the ECG+noise signal s. Then, by subtracting the filtered noise correlated reference signal r' from the ECG+noise signal s, effective cancellation of the noise can be achieved. Although such an adaptive filtering technique may be effective for certain applications, such technique is not ideal and difficulties still remain.

An ECG output signal is shown in FIG. 1B. An ECG waveform for a single beat is typically referred to as a PQRST complex. At initiation of a heart beat, a P wave appears. This corresponds to activity in the artia. The QRST complex then follows the P wave. The QRST complex corresponds to ventricular activity. More specifically, it is generally understood that the QRS portion of the wave corresponds to electrical activation of the ventricles and the T wave corresponds to their electrical recovery. The ST segment is relatively quiescent.

A typical ECG signal contains a 60 Hz component during a limited period of time. That is, a 60 Hz component is present in the QRS complex. During this short period the reference signal is highly correlated with the pure ECG signal. The adaptive filter coefficients are updated incorrectly. This results in a 60 HZ disturbance in the ST-segment before the coefficients readjust. Accordingly, if a filter is used to remove 60 Hz noise, a portion of the actual ECG signal itself is removed, thus an error occurs when using filter 10, resulting in disturbance in the desired ECG signal. For example, FIG. 2A shows an ECG signal with simulated 50 Hz power line interference added. FIG. 2B shows the result of using filter 10 on the signal shown in FIG. 2A. FIG. 2C shows a closer look at a ST-segment of the filtered signal, the ST-segment being corrupted by 50 Hz interference.

Accordingly, a need exists for a efficient system for eleminating noise in an ECG signal.

SUMMARY OF THE INVENTION

A signal filter includes a first adaptive filter receiving a desired signal containing a noise component and a first noise correlated reference signal, and outputting a first filtered output signal. A second adaptive filter, receives the desired signal containing the noise component and a second noise correlated reference signal and outputs a second filtered output signal. Signal filter parameters of the second adaptive filter are controlled based on the first filtered output signal and the second filtered output signal. The first and second noise correlated reference signals may be the same. The signal filter parameters of the first adaptive filter are adapted according to the formula $W_{1,n+1} = W_{1,n} + \mu y_1(n) r^*(n)$, where n is the sample number and $\mu$ is the step size. The signal filter parameters of the second adaptive filter are adapted according to the formula $W_{2,n+1} = W_{2,n} + \eta(n) \mu y_2(n) r^*(n)$, where n is the sample number, $\mu$ is the step size and $\eta$ is a weighted signal based on the first filtered output signal. The first adaptive filter may include an adder, a finite impulse response (FIR) filter and an adaptive processor for controlling the adaptive parameters of the FIR filter. The second adaptive filter may include an adder, a second finite impulse response (FIR) filter and a second adaptive processor for controlling the adaptive parameters of the second FIR filter. A mathematical operation unit can be provided for outputting a weighted output signal based on the first filtered output signal, the weighted output signal being provided to the second adaptive filter as the first filtered output signal.

According to another aspect, a signal filtering method includes receiving a desired signal containing a noise component and receiving a noise correlated reference signal. Filtering of the noise correlated reference signal is performed using a first set of adaptive parameters to provide a first filtered noise correlated reference signal. The first filtered noise correlated reference signal is subtracted from the desired signal containing the noise component to provide a first output signal. The first set of adaptive parameters are controlled based on the first output signal. Filtering of the noise correlated reference signal is performed using a second set of adaptive parameters and a signal corresponding to the first output signal to provide a second filtered noise correlated reference signal and the second filtered noise correlated reference signal is subtracted from the desired signal containing the noise component to provide a second output signal, the second output signal being the desired signal with a minimized noise component. The second set of adaptive parameters is controlled based on the second output signal. The first adaptive parameters may be adapted according to the formula $W_{1,n+1}=W_{1,n}+\mu y_1(n)r^*(n)$, where n is the sample number and $\mu$ is the step size. The second adaptive parameters may be adapted according to the formula $W_{2,n+1}=W_{2,n}+\eta(n)\mu y_2(n)r^*(n)$, where n is the sample number, $\mu$ is the step size and $\eta$ is a weighted signal based on the first output signal. The signal filtering method may further include a step of performing a mathematical operation on the first output signal to provide a weighted output signal as the signal corresponding to the first output signal.

According to another aspect, a signal filtering system includes a coarse filter including a subtractor for subtracting a first filtered noise correlated reference signal from a desired signal containing a noise component and providing a first output signal, a filter for receiving and filtering a noise correlated reference signal using a first set of adaptive parameters and outputting the first filtered noise correlated reference signal, and an adaptive processor for adaptively processing the adaptive parameters based on the first output signal. The system also includes a signal filter including a subtractor for subtracting a second filtered noise correlated reference signal from the desired signal containing the noise component and providing a second output signal, a filter for receiving and filtering the noise correlated reference signal using a second set of adaptive parameters and information corresponding to the first output signal and outputting the second filtered noise correlated reference signal, and an adaptive processor for adaptively processing the second adaptive parameters based on the second output signal. The system may further include a mathematical operation unit for performing a mathematical operation on the first output signal and providing an output to the signal filter as the information corresponding to the first output signal. The second output signal may include the desired signal with a minimized noise component. The filters can be finite impulse response filters.

According to another aspect, a signal filter includes a filter receiving a noise correlated reference signal and outputting a filtered noise correlated reference signal filtered based on a set of parameters and a weighted signal. A subtractor subtracts the filtered noise correlated reference signal from a desired signal including a noise component and outputs an output signal. A processor modifies the set of parameters based on the output signal. The signal filter may further include a second filter receiving the noise correlated reference signal and outputting a second filtered noise correlated reference signal based on a second set of parameters. A subtractor subtracts the second filtered noise correlated reference signal from the desired signal including a noise component and outputs a second output signal. A processor modifies the second set of parameters based on the second output signal. The signal filter may further include a mathematical operation unit receiving the second output and outputting the weighted signal.

Methods are also described for determining the noise correlated reference signal.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

Figure 1A:
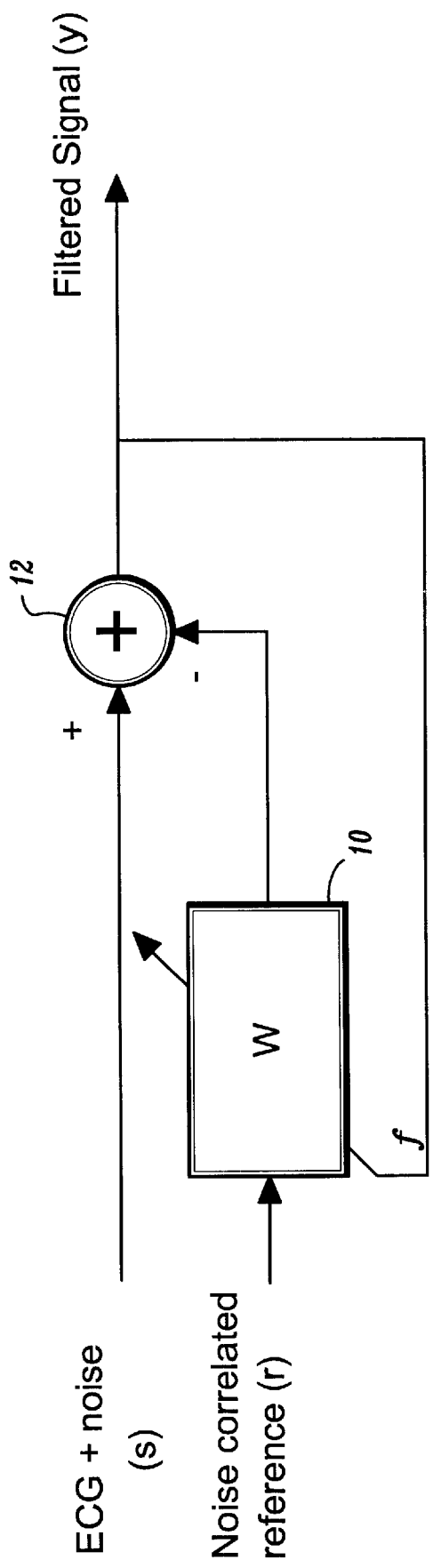
FIG. 1A is a block diagram of an adaptive filtering technique.
Figure 1B:
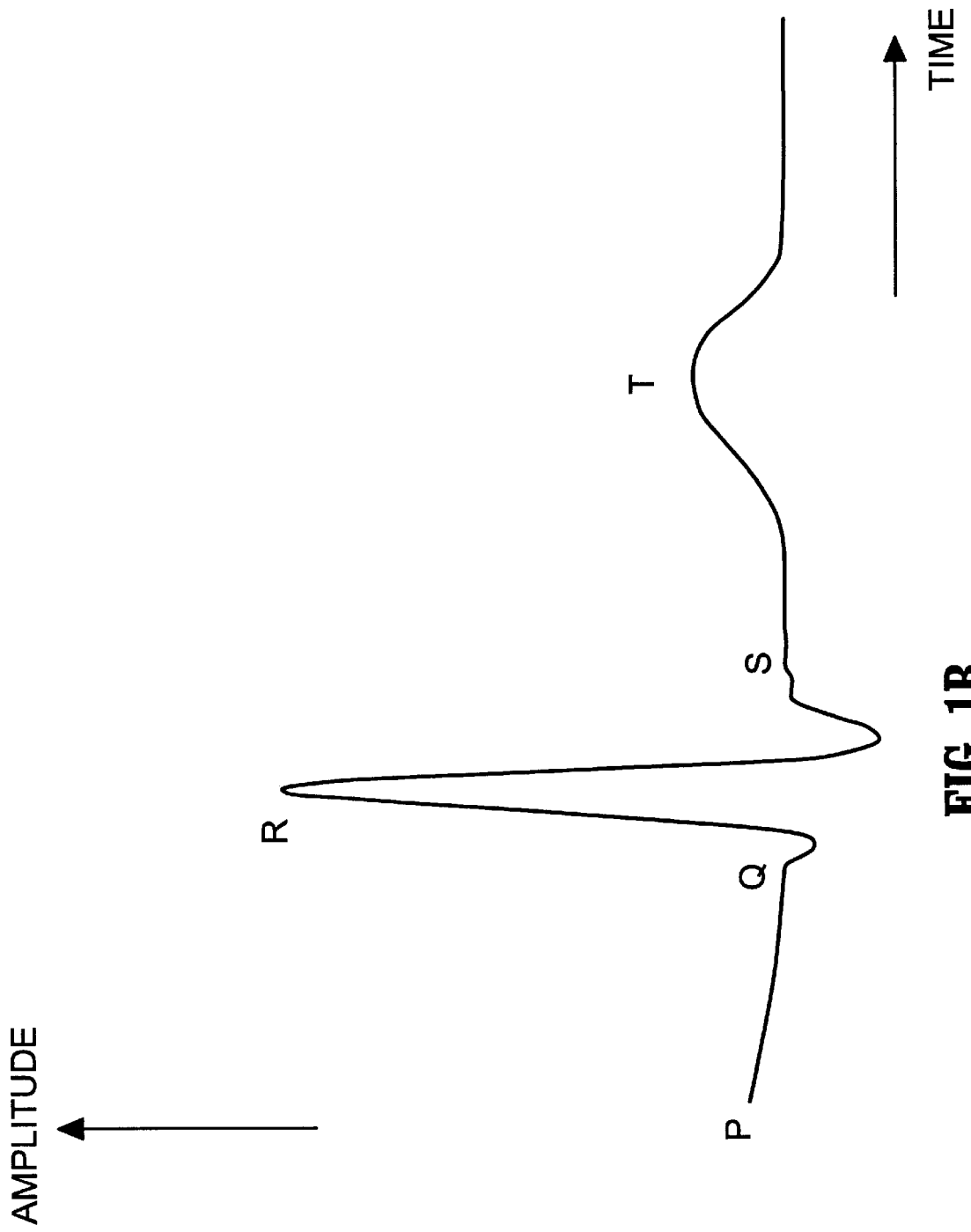
FIG. 1B is a schematic representation of an ECG waveform.

DESCRIPTION OF A PREFERRED
EMBODIMENT OF THE PRESENT INVENTION

In describing preferred embodiments of the present invention illustrated in the drawings, specific terminology is employed for the sake of clarity. However, the present invention is not intended to be limited to the specific terminology so selected and it is to be understood that each specific element includes all technical equivalents which operate in a similar manner.

The adaptive filtering technique described herein can be implemented in software, firmware, hardware or any combination of these techniques.

Because an ECG does not contain a 60 Hz component other than that occurring during the QRS, problems could be avoided if updating of the parameters could be reduced for the relatively short period of time during the QRS complex. However, if the updating is reduced by an input magnitude, the filter will never adapt at high noise levels. A peak detector causes delay and a slope detector is hard to design because of the resemblance between power line interference and the QRS. The present invention provides an effective and efficient system for filtering noise from, for example, a medical diagnostic signal.

Figure 3:
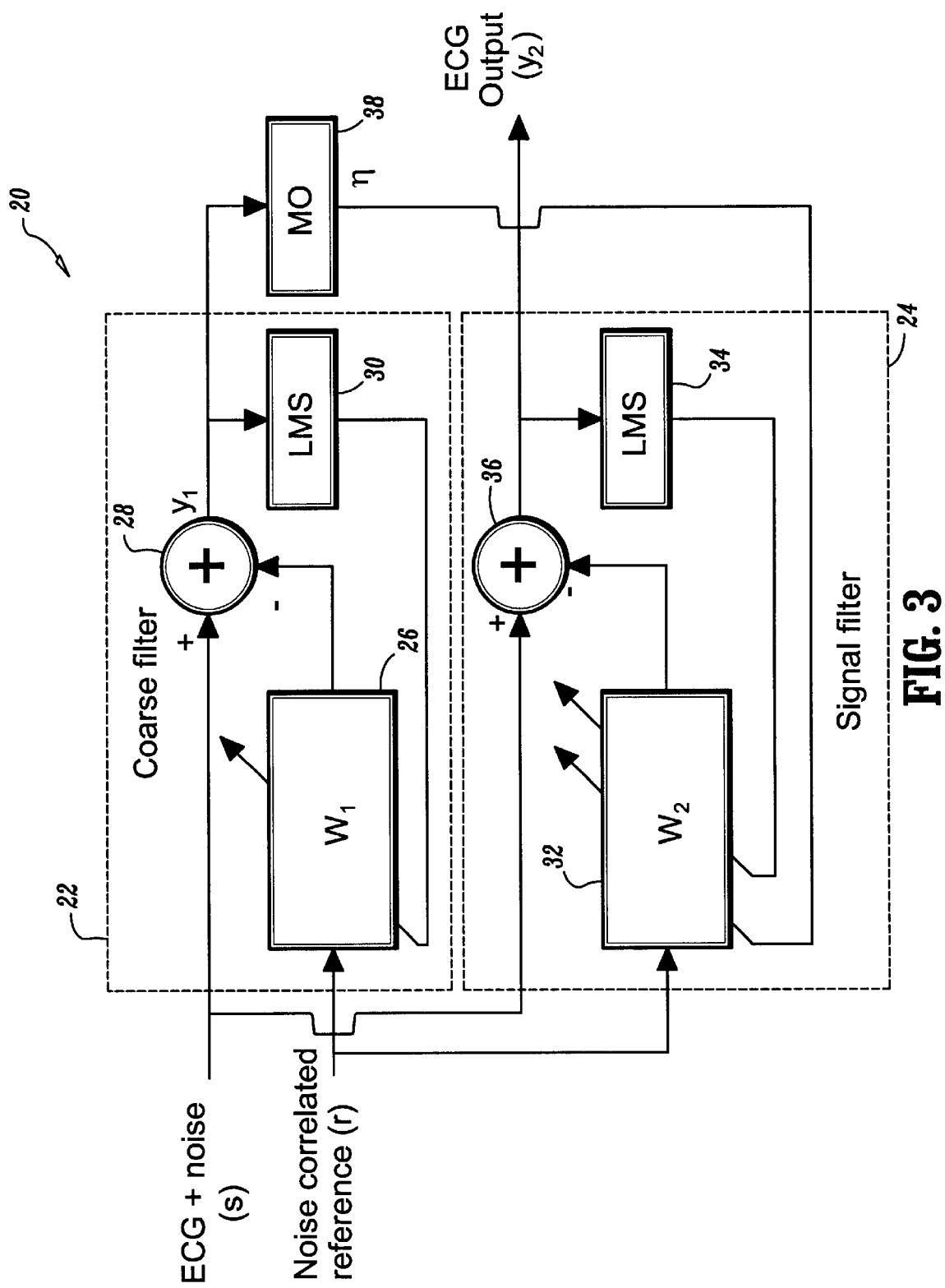
FIG. 3 shows a block diagram of a two step adaptive filtering technique according to an embodiment of the present invention.

Referring now to the drawings in which like reference numerals designate identical or corresponding parts throughout the several views, an embodiment of the present invention is shown in FIG. 3 and is referred to generally as filter 20. Filter 20 has two parallel adaptive filter portions including a course filter 22 and a signal filter 24.

As shown in FIG. 3, the output from parallel adaptive filter 22 regulates the updating of the signal filter 24. The output from signal filter 24 provides the final filtered ECG output signal $y_2$. By tuning the course filter output by a suitable mathematical operation (MO) 38, a weight factor between 0 and 1 can be derived to regulate the stepsize of the signal filter 24.

More specifically, the ECG+noise signals is input to subtractor 28 of coarse filter 22 and to subtractor 36 of signal filter 24. The noise correlated reference signal r is input to filter 26 of coarse filter 22 and to filter 32 of signal filter 24. As shown in FIG. 3, each of the course filter 22 and the signal filter 34 use the least mean square (LMS) as the adaptive process for controlling the parameters of the respective FIR filters 26 and 32. That is, the output $y_1$ of subtractor 28 in coarse filter 22 is subjected to an LMS process 30 as the adaptive process and fed back to filter 26.

Using the notations according to FIG. 3, the course filter parameters can be updated as follows:

$$W_{1,n+1} = W_{1,n} + \mu y_1(n) r^*(n) \quad (2)$$

where n is the sample number and $\mu$ is the step size.

Block MO 38 represents a mathematical operation which transforms the course filter output into the weight factor $\eta$ which is applied to filter 32 of signal filter 24. The output $y_2$ (the ECG Output signal) of subtractor 36 in signal filter 24 is subjected to an LMS process 34 as the adaptive process and fed back to filter 32. The output $y_1$ of subtractor 28 is subjected to a mathematical operation by unit 38. The output $\eta$ of unit 38 is also used to control the parameters of filter 32. That is, the output $y_1$ of course filter 22 is used to modify the step size of filter 32, to reduce the updating during the QRS period of the ECG signal.

Accordingly, the signal filter parameters of filter 32 adapt according to:

$$W_{2,n+1} = W_{2,n} + \eta(n)\mu y_2(n) r^*(n) \quad (3)$$

An example of a mathematical operation 38 which can be applied to coarse filter output signal $y_1$ is $\eta = 1/(1+\beta\alpha^{|y_1|})$ where $\beta$ and $\alpha$ are constants.

This effectively controls or reduces the updating during QRS without introducing any signal delay. The filter causes a lower degree of distortion of the ECG than ordinary adaptive filtering does and it is independent of variations in frequency of the powerline interference.

Figure 2A:
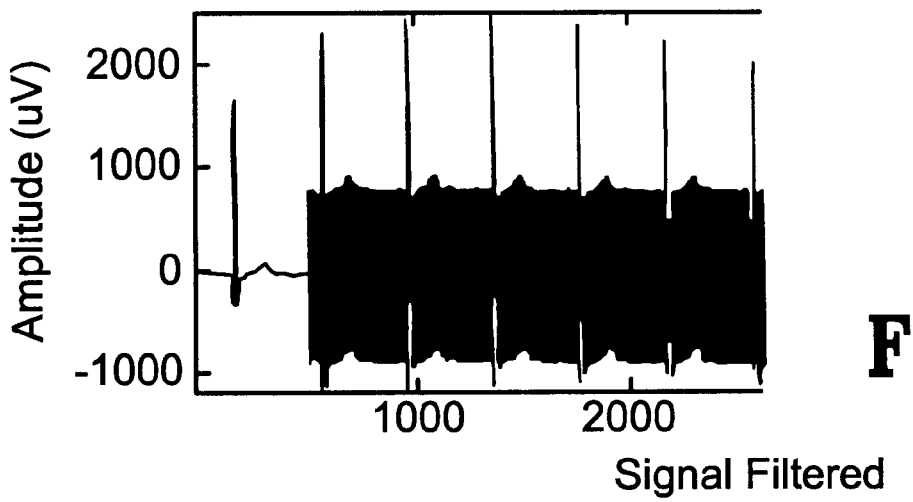
FIGS. 2A–2C show waveform signals including frequency components around interference frequency in the ECG which causes distortion in the filtered signal. The input is a repeated real ECG segment with 50 Hz interference.
Figure 2B:
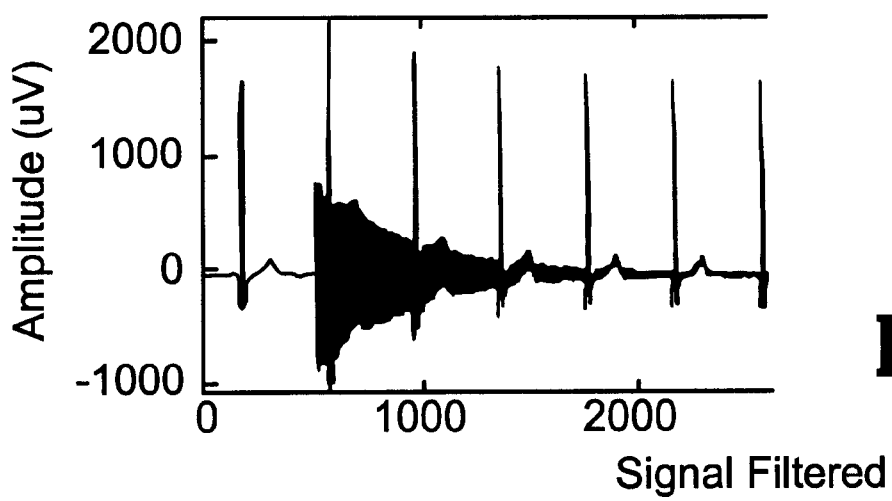
Figure 2C:
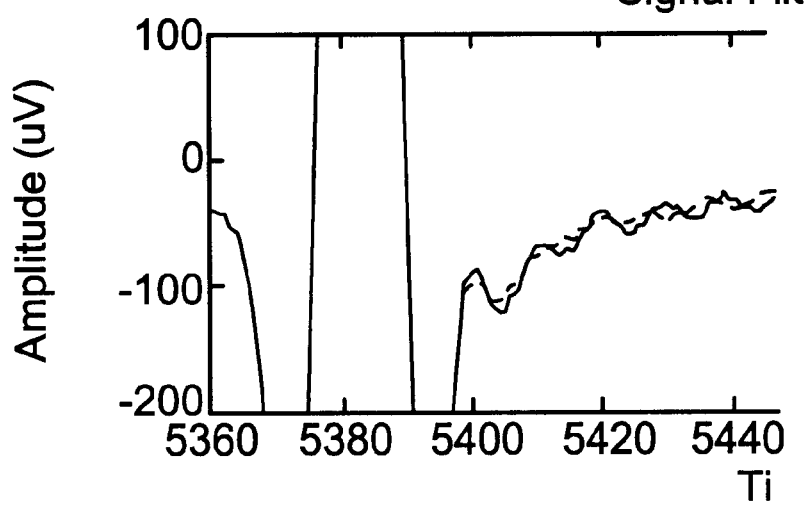
Figure 4A:
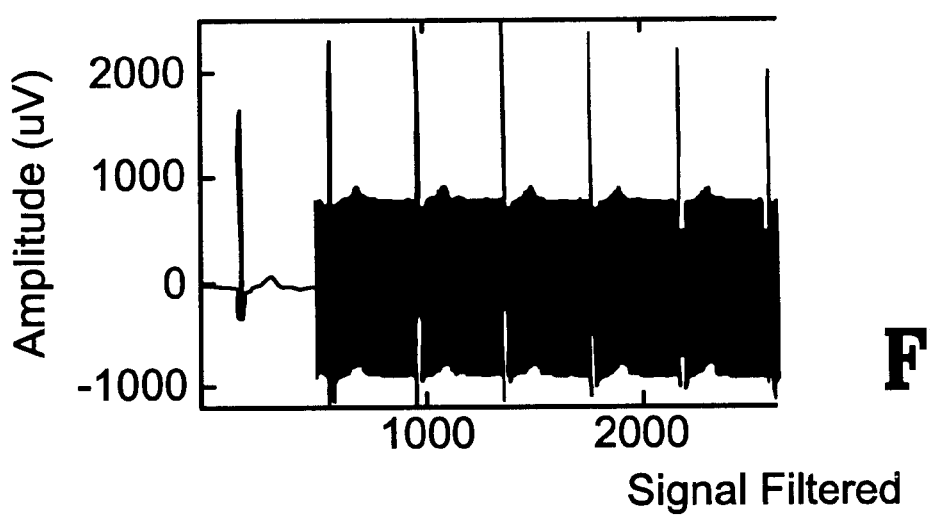
FIGS. 4A–4C show waveform signals in which a two step adaptive filter according to an embodiment of the present invention causes a lower degree of distortion than an ordinary adaptive filter.
Figure 4B:
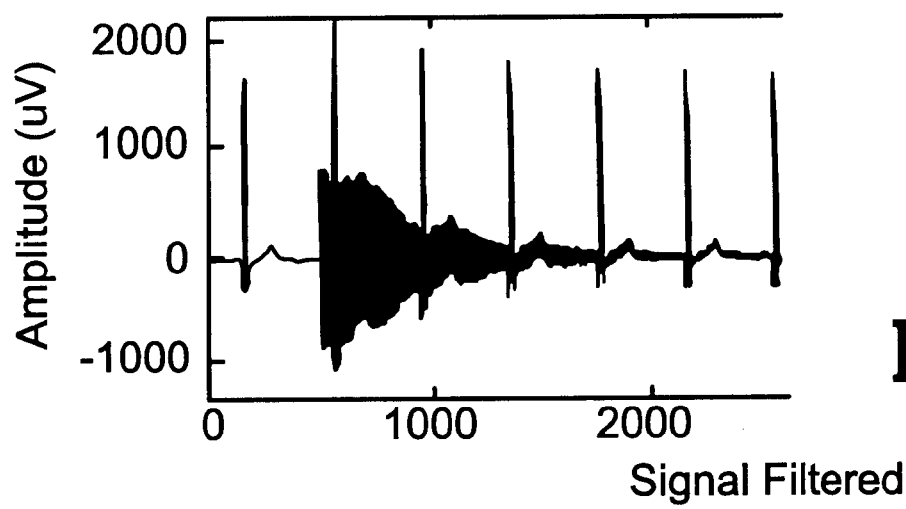
Figure 4C:
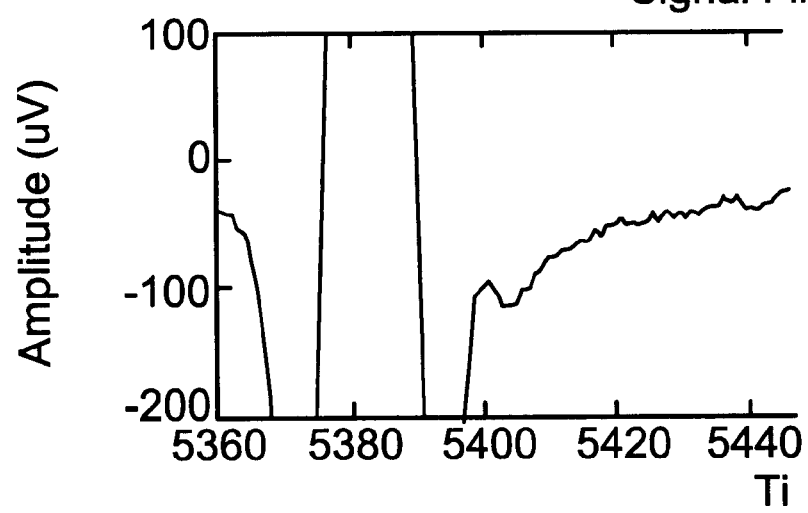

In FIG. 4, it can be seen that ECG disturbance is lowered compared to that shown in FIG. 2. For example, FIG. 4A shows an ECG signal with simulated 50 Hz power line interference added. FIG. 4B shows the result of using filter 20 on the signal shown in FIG. 4A. FIG. 4C shows a closer look at the ST-segment of the filtered signal.

As shown, the ST-segment is less corrupted by 50 Hz interference when compared to the use of filter 10. More specifically, to give a concrete measurement of the improvement, distortion is defined as mean square deviation from true ECG. The distortion of the filtered signal in FIG. 2 is 4.61 $\mu$V compared to 0.53 $\mu$V when the two step adaptive filter is used as shown in FIG. 4.

It may be preferable that the input signal for coarse filter 22 be filtered. Otherwise, coarse filter 22 may be overly sensitive to low frequency baseline drift or multiples of 50/60 HZ.

Various methods are known for generating noise correlated reference signal (r) and may be used. Preferably, however, one of the following methods is used for providing the noise correlated reference signal.

The below described methods of providing the noise correlated reference signal trace the frequency of the power line interference in the ECG signal. Most filters that are used to reduce the interference are sensitive to variations of the frequency around 50 or 60 Hz, especially if the magnitude of the interference is large. A traced frequency can be used as a parameter in such filters. Two methods of tracing frequency are described below in detail. Briefly, the first method is referred to as the energy tracer method and lets several inverted notch filters (INOTCH filters) run in parallel on one of the ECG leads. The energies of the produced signals are compared and used to determine the frequency of the interference. The second method is referred to as the period tracer method and uses only one INOTCH filter on one of the ECG leads. In the period tracer method, the INOTCH filter produces a fairly undisturbed sinusoidal interference signal. The number of periods of a time interval is counted and the frequency is calculated.

Both methods yield the frequency of the interference, which can be used directly as a parameter for various types of filters including, for example, a Mortara filter or to generate the noise correlated reference signal for the LMS filters used in the above-described dual adaptive filtering method. For purposes of the following explanation, the power line frequency is described as varying from 49.9 to 50.1 Hz. However, it will be appreciated that the methods described herein are applicable to arbitrary frequency intervals and are not limited to the intervals described in the embodiments. Although the below described methods have been adjusted to this frequency interval, the frequency interval can easily be modified for other intervals.

Figure 5:
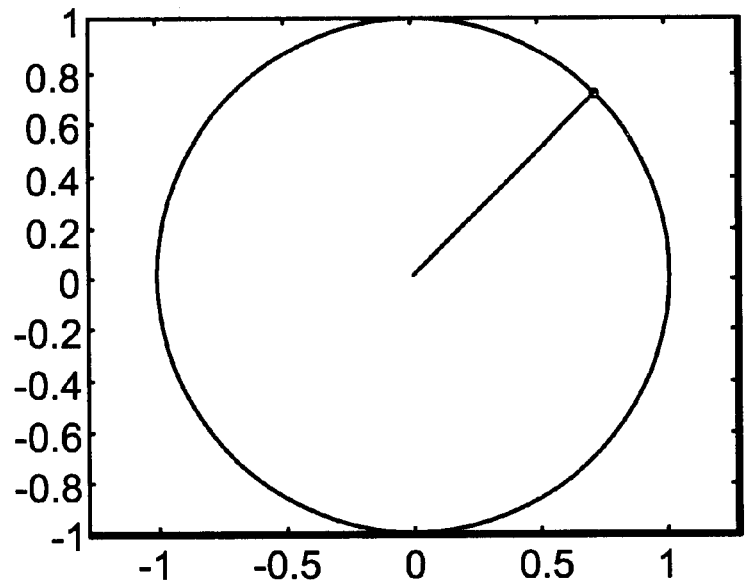
FIG. 5 is a diagram showing the zero and the pole of a notch filter, a radius of the pole determining how narrow the stop band is.
Figure 6:
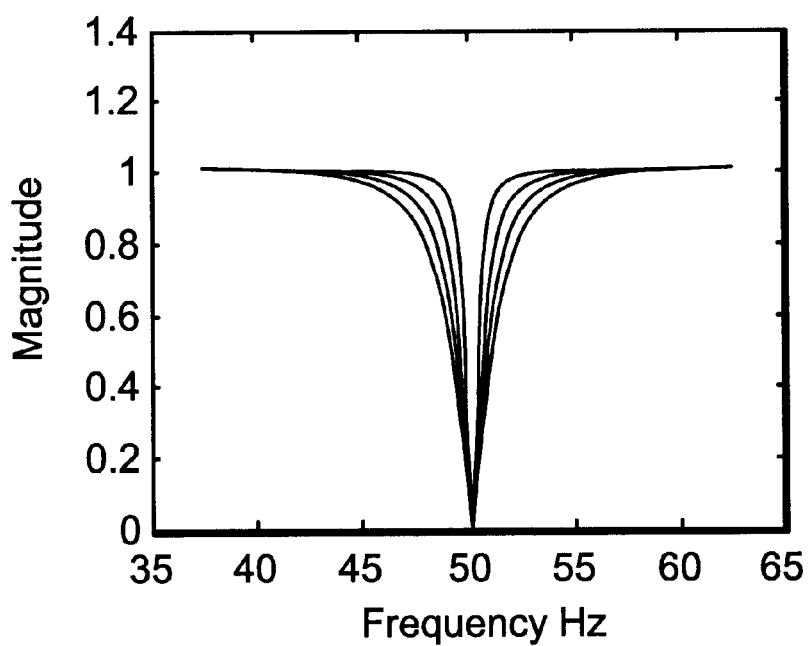
FIG. 6 is a diagram showing the frequency response of a plurality of notch filters with varying radius.

A notch filter has a well defined stop band center and is constructed by placing a zero on a unit circle at a desired stop band center frequency and a pole inside the unit circle, on the same radius as the zero. The zero and pole of a notch filter are depicted in FIG. 5. The distance from the pole to the origin is defined as r. Varying r affects the transition from the stop band to the pass band. The closer r is to unity, the narrower the stop band. A notch filter is a simple infinite impulse response (IIR) filter with five terms in the time domain expression. The output from the filter is expressed as $$y(i) = x(i) - (2\cos\omega_0)x(i-1) + x(i-2) - (2r\cos\omega_0)y(i-1) - r^2 y(i-2) \quad (4)$$

where x(i) is the input signal sequence and y(i) is the output signal sequence. $\omega_0$ is the desired angular frequency of the filter expressed as $\omega_0 = 2\pi f_c/f_s$, where $f_c$ is the notch center frequency, $f_s$ is the sampling frequency and r is the radius of the pole. The frequency response of 50 Hz notch filters with a few different values of r is depicted in FIG. 6.

In order to make a filter that emphasizes the power line interference, the inverse of a notch filter can be used, an INOTCH filter. The output signal of an INOTCH filter, a(i), is produced by subtracting the input signal from the output signal of a notch filter:

$$a(i)=x(i)-y(i)=(2\cos\omega_0)x(I-1)-(2r\cos\omega_0)y(I-1)-r_2y(i-2) \quad (5)$$

Figure 7C:
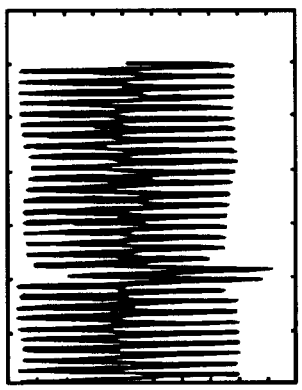
FIGS. 7A–7C shown an ECG signal disturbed by 50 Hz noise, an output from a 50 Hz notch filter and a closer look at the signal, respectively.
Figure 7B:
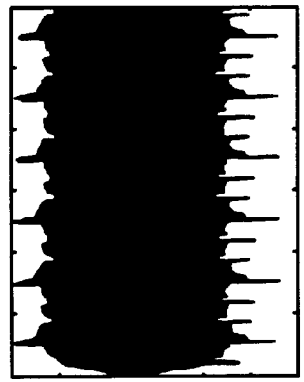
Figure 7A:
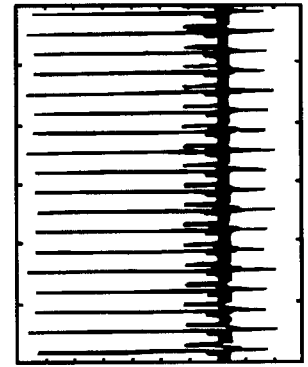

The performance of an INOTCH filter is depicted in FIGS. 7A–7C. An ECG signal with added 50 Hz noise is shown in FIG. 7A. The output signal from a 50 Hz INOTCH filter is shown in FIG. 7B. A closer look at the output from the INOTCH filter can be seen in FIG. 7C. As shown, the signal is disturbed by the 50 Hz component of the QRS complex in the ECG signal. However, if the power line interference is large enough, it has little influence on the frequency trace.

Figure 9:
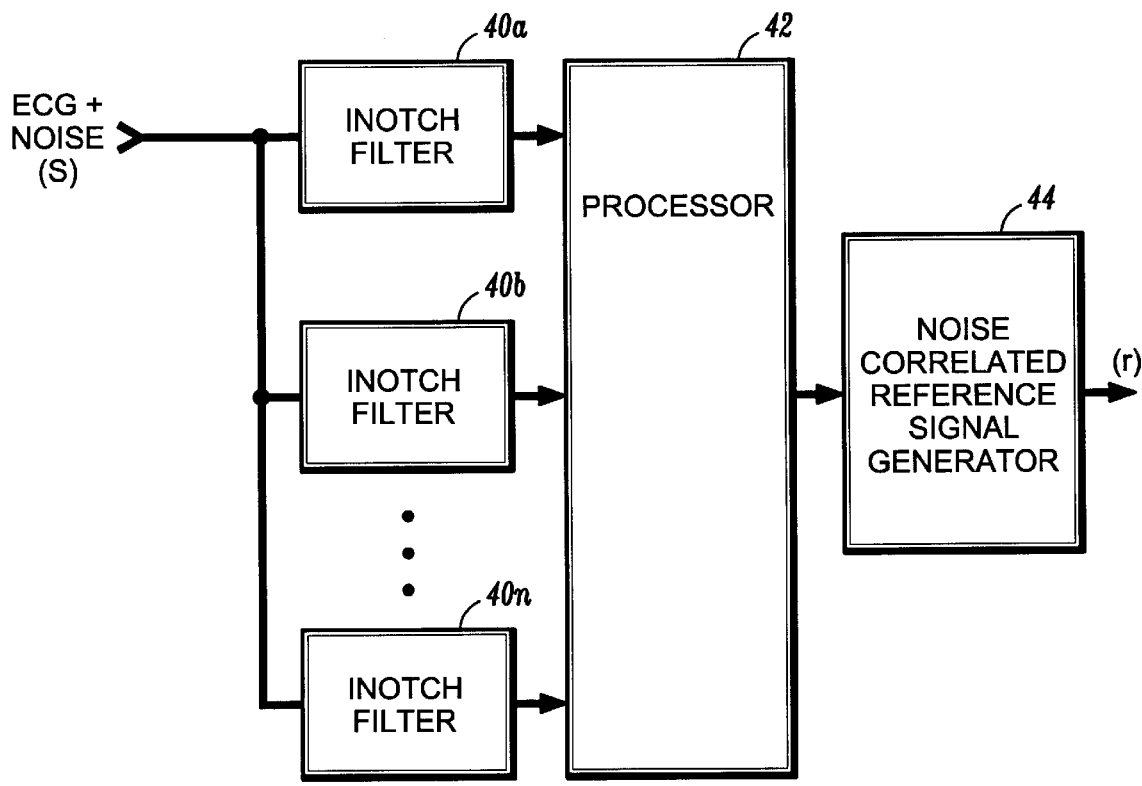
FIG. 9 is a block diagram showing a plurality of INOTCH filters used to determine a noise correlated reference signal.

The first method, the energy tracer method, runs several INOTCH filters with different center frequencies in parallel. As shown in FIG. 9, the ECG plus noise signal is input to a plurality of INOTCH filters $40a$–$40n$. As will be described below, each filter has a different center frequency. The outputs of filters $40a$–$40n$ are processed by processor 42 to determine the optimum noise frequency. The determined frequency is then used by generator 44 to generate noise correlated reference signal (r). When the filters $40a$–$40n$ have stabilized, the energies of the output signals are compared. The energy is calculated as the sum of squares for the time interval of the signal. The amplitude of the output signals from the INOTCH filters, and thus the energies, depend on how close the center frequencies are to the frequency of the disturbance. The highest energy level will therefore reveal the frequency of the interference. The frequency corresponding to the INOTCH filter with the highest energy level can then be used as the noise correlated reference signal frequency in the dual adaptive filtering method shown in FIG. 4.

The accuracy of the energy trace method will depend on how many filters 40 are used. Each filter requires five multiplications and five additions or subtractions every sample. In addition, to calculate the energy, one multiplication and one addition for each sample is necessary. Information from a few widely spread filters could be used to decide now to proceed with finer frequency tracing, although it generally takes time for the output signal from the filters to stabilize. Therefore, it is recommended that the same filters run constantly for a period of time to produce stable signals, before changing any filters. For most purposes, 11 filters equally spaced in the desired interval (e.g. 49.9–50.1 Hz) is sufficient. For example, if 11 filters are used, the distance between the filters is 0.02 Hz and, accordingly, the accuracy of the frequency trace is +/−0.01 Hz. This accuracy is sufficient in most instances.

To measure the performance of the energy tracer method, noise of different frequency and amplitude was added to a simulated ECG signal. It should be noted that the stabilization is faster for simulated noise than for real power line interference, likely because the simulated noise is a perfect sinusoid and the shape of the power line interference varies and is corrupted by noise.

It was found that the performance of the energy tracer method was affected by the choice of radius selected for the INOTCH filters. A value close to one makes the filters more distinct so that the energies of the output signals differ more, thus making the frequency selection easier. On the other hand, round off errors may make the filters unstable if the radius is close to one. By inspection r=0.998 seemed to provide the most suitable results.

In addition, the accuracy of the frequency prediction is increased by the time interval used for energy calculation. It has been found that one second at 500 Hz is sufficient to make a correct frequency prediction if the energy of the interference is large enough. However, the filters must reach stability before calculating the energy.

Figure 8:
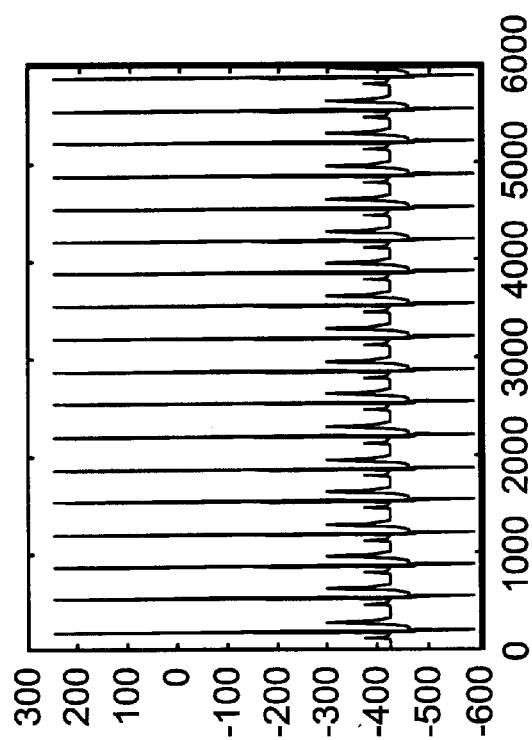
FIG. 8 is a simulated ECG signal used to measure performance of frequency tracer method used to determine a noise correlated reference signal.

A simulated ECG signal is depicted in FIG. 8. The height of the ECG signal is approximately 840 units from top to bottom, which corresponds to 2.1 mV. In order for the energy tracer method to make correct predictions in one second, the amplitude of the noise must be at least 19 units (approx. 47.5 $\mu$V). This corresponds to a noise to signal energy ratio of 0.00108. The required noise level is affected very little by baseline drift or smooth changes in amplitude of the interference. However, if the noise signal contains discontinuities, the noise level must increase significantly to make a correct prediction. In a real ECG measurement these discontinuities will not affect the frequency trace since they are typically suppressed by hardware.

The performance of the energy trace method was also investigated by applying a sinusoidal (noise) signal from a wave generator in real time to a simulated ECG signal. This produced noise that is not as perfectly sinusoidal as the simulated noise and made it possible to study the stabilization times for the filters. In most cases, the correct frequency within an error of one step (0.02 Hz) was found within ten seconds as long as the level of the interference was large enough. After twenty seconds the frequency can be correctly determined in most cases, although on some rare occasions this can take up to thirty seconds.

The frequency of the power line interference changes very slowly. Accordingly, once the frequency has been accurately determined, there is no need to update it for a while. A reasonable implementation would be to start the frequency at 50 Hz, update if after ten seconds, then again at twenty seconds, and then again at one minute and then update it every ten minutes. To increase the accuracy of the method even more, more than one second of the signal for energy calculations can be used.

The second method, the period tracer method, uses a 50 Hz INOTCH filter to produce a power line interference signal close to 50 Hz. The number of sinusoidal periods is then counted and the frequency is calculated. The frequency is calculated as:

$$F=f_s(\eta_p/\eta_s) \quad (6)$$

where $f_s$ is the sampling frequency, $\eta_p$ the number of observed periods, and $\eta_s$ the number of samples during the same time interval.

Figure 10:
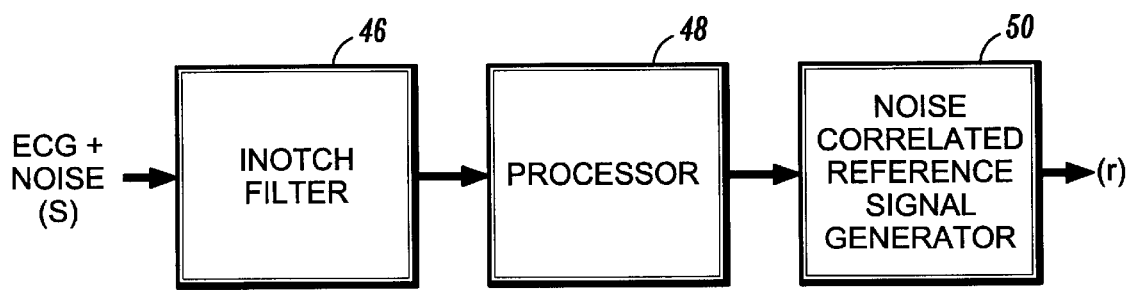
FIG. 10 is a block diagram showing a single INOTCH filter used to determine a noise correlated reference signal.

As shown in FIG. 10, the ECG plus noise signal is input to INOTCH filter 46, the output if which is processed by processor 48 and used by generator 50 to generate noise correlated reference signal (r).

The advantage of this method is that it requires few computations and the results get better and better as the method runs. In addition, it is also easy to measure the magnitude of the power line interference. A measure of the magnitude would be useful to decide if the predicted frequency is reliable. However, to reach the same accuracy as the energy tracer method, 25000 samples (50 secs) must pass after the filter has stabilized. For this purpose 2–3 secs is generally enough for the filter to stabilize.

As in the case of the energy tracer method, the performance of the period tracer method is affected by the radius of the INOTCH filter. In this case, a wider filter should by used. The amplification of all frequencies in the interval 49.9–50.1 Hz should be comparable. By inspection, it has been determined that r=0.99 is suitable.

A measure of the performance of the period tracer method was conducted in the same way as for the energy tracer method. A simulated ECG signal of the same magnitude was used. The frequency and the amplitude of the added noise was varied. There are several ways to count the number of periods of the signal. For example, the number of times zero is passed can be determined. It was determined that this approach required a 12 unit (30 $\mu$V) disturbance signal. This result can be improved by studying the slope of the signal. That is, the period counter is increased when the slope has first been positive and then negative. It was determined that this approach required a 7 unit (17.6 $\mu$V) disturbance signal. From these values, it can be seen that the noise to signal energy ratios are 0.00043 and 0.00015, respectively. The output from the INOTCH filter is affected by the 50 Hz component in the QRS complex as depicted in FIG. 7. Counting the number of zero passes is more sensitive to such variations, although an error may originate from not counting one or two such periods. This result can be improved by counting the number of periods as the signal passes several different thresholds. The maximum number of periods is then picked.

The period tracing method was also tried in real time with a generated noise signal from a wave generator. A 50s signal yields the same accuracy as the energy tracer method. In theory at least, the period tracing method should become better and better as time passes and should be able to predict the frequency with infinite accuracy, although experiments performed yielded at the most two decimal accuracy. The output signal from the INOTCH filter seems to loose energy. Accordingly, in reality, the period tracer method requires a larger disturbance than the energy tracer method.

A reasonable implementation of the period tracer method would be to first set the frequency of 50 Hz. The frequency could then be updated after thirty seconds, again at one minute and then again at three minutes. The frequency could then be updated every ten minutes from the number of periods of the last three minutes.

The energy tracer method and the period trace method have proven to be able to predict the frequency of the power line interference with desired accuracy. The advantage of the period tracer method is that it requires less computations. However, the energy tracer method is faster.

Numerous addition modifications and variations of the present specification are possible in light of the above teachings. It is therefore to be understood that within the scope of the appended claims, the present application may be practiced otherwise than as specifically described herein.

This document is based on Provisional Application Serial No. 60/101,940 filed Sep. 25, 1998, the entire contents of which are hereby incorporated by reference.

What is claimed is:

1. A signal filter comprising:
   a first adaptive filter receiving a desired signal containing a noise component and a first noise correlated reference signal, and outputting a first filtered output signal; and
   a second adaptive filter, receiving the desired signal containing the noise component and a second noise correlated reference signal and outputting a second filtered output signal, wherein signal filter parameters of the second adaptive filter are controlled based on the first filtered output signal and the second filtered output signal.

2. A signal filter as recited in claim 1, wherein the first and second noise correlated reference signals are the same.

3. A signal filter as recited in claim 1, wherein signal filter parameters of the first adaptive filter are adapted according to the formula $W_{1,n+1}=W_{1,n}+\mu y_1(n)r^*(n)$, where n is the sample number and $\mu$ is the step size.

4. A signal filter as recited in claim 1, wherein the signal filter parameters of the second adaptive filter are adapted according to the formula $W_{2,n+1}=W_{2,n}+\eta(n)\mu y_2(n)r^*(n)$, where n is the sample number, $\mu$ is the step size and $\eta$ is a weighted signal based on the first filtered output signal.

5. A signal filter as recited in claim 1, wherein the first adaptive filter comprises an adder, a finite impulse response (FIR) filter and an adaptive processor for controlling the adaptive parameters of the FIR filter.

6. A signal filter as recited in claim 5, wherein the second adaptive filter comprises an adder, a second finite impulse response (FIR) filter and a second adaptive processor for controlling the adaptive parameters of the second FIR filter.

7. A signal filter as recited in claim 6, further comprising a mathematical operation unit for providing a weighted output signal based on the first filtered output signal, the weighted output signal being provided to the second adaptive filter as the first filtered output signal.

8. A signal filter as recited in claim 1, further comprising a plurality of inverted notch filters, each inverted notch filter having a different center frequency, wherein the desired signal containing the noise component is input to the plurality of inverted notch filters, and wherein an amplitude of an output from each inverted notch filter is determined, the amplitude varying depending upon how close the center frequency is to a frequency of the noise component.

9. A signal filter as recited in claim 8, wherein a frequency corresponding to the notch filter having the largest amplitude output is selected and used as the noise correlated reference signal.

10. A signal filtering method comprising:
    receiving a desired signal containing a noise component;
    receiving a noise correlated reference signal;
    filtering the noise correlated reference signal using a first set of adaptive parameters to provide a first filtered noise correlated reference signal;
    subtracting the first filtered noise correlated reference signal from the desired signal containing the noise component to provide a first output signal;
    controlling the first set of adaptive parameters based on the first output signal;
    filtering the noise correlated reference signal using a second set of adaptive parameters and a signal corresponding to the first output signal to provide a second filtered noise correlated reference signal;
    subtracting the second filtered noise correlated reference signal from the desired signal containing the noise component to provide a second output signal, the second output signal being the desired signal with a minimized noise component; and
    controlling the second set of adaptive parameters based on the second output signal.

11. A signal filtering method as recited in claim 10, wherein the first adaptive parameters are adapted according to the formula $W_{1,n+1}=W_{1,n}+\mu y_1(n)r^*(n)$, where n is the sample number and $\mu$ is the step size.

12. A signal filtering method as recited in claim 10, further comprising a step of performing a mathematical operation on the first output signal to provide a weighted output signal as the signal corresponding to the first output signal.

13. A signal filtering system comprising:
    a coarse filter comprising,
       a subtractor for subtracting a first filtered noise correlated reference signal from a desired signal containing a noise component and providing a first output signal, a filter for receiving and filtering a noise correlated reference signal using a first set of adaptive parameters and outputting the first filtered noise correlated reference signal, and an adaptive processor for adaptively processing the adaptive parameters based on the first output signal; and a signal filter comprising, a subtractor for subtracting a second filtered noise correlated reference signal from the desired signal containing the noise component and providing a second output signal, a filter for receiving and filtering the noise correlated reference signal using a second set of adaptive parameters and information corresponding to the first output signal and outputting the second filtered noise correlated reference signal, and an adaptive processor for adaptively processing the second adaptive parameters based on the second output signal.

14. A signal filtering system as recited in claim 13, further comprising an mathematical operation unit for performing a mathematical operation on the first output signal and providing an output to the signal filter as the information corresponding to the first output signal.

15. A signal filtering system as recited in claim 14, wherein the second output signal comprises the desired signal with a minimized noise component.

16. A signal filtering system as recited in claim 14, wherein the filters comprise finite impulse response filters.

17. A signal filter comprising:

a first filter receiving a noise correlated reference signal and outputting a filtered noise correlated reference signal based on a set of parameters and a weighted signal;

a subtractor for subtracting the filtered noise correlated reference signal from a desired signal including a noise component and outputting a first output signal;

a processor for modifying the set of parameters based on the first output signal;

a second filter receiving the noise correlated reference signal and outputting a second filtered noise correlated reference signal based on a second set of parameters;

a second subtractor for subtracting the second filtered noise correlated reference signal from the desired signal including a noise component and outputting an second output signal; and a second processor for modifying the second set of parameters based on the first output signal and the second output signal.

18. A signal filter as recited in claim 17, further comprising a mathematical operation unit receiving the second output and outputting the weighted signal.

* * * * *